(12) United States Patent
Lee et al.

(10) Patent No.: US 11,158,626 B2
(45) Date of Patent: Oct. 26, 2021

(54) SEMICONDUCTOR INTEGRATED CIRCUIT DEVICE INCLUDING AN ELECTROSTATIC DISCHARGE PROTECTION CIRCUIT

(71) Applicant: SK hynix Inc., Gyeonggi-do (KR)

(72) Inventors: Chang Hwi Lee, Seoul (KR); Hee Jeong Son, Gyeonggi-do (KR); Ki Ryong Jung, Gyeonggi-do (KR); Seung Yeop Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/875,749

(22) Filed: Jan. 19, 2018

(65) Prior Publication Data

US 2018/0350797 A1  Dec. 6, 2018

(30) Foreign Application Priority Data

May 31, 2017 (KR) .................. 10-2017-0067643

(51) Int. Cl.
*H01L 27/02* (2006.01)
*H02H 9/04* (2006.01)
*H01L 27/088* (2006.01)

(52) U.S. Cl.
CPC ........ *H01L 27/0266* (2013.01); *H01L 27/027* (2013.01); *H01L 27/0255* (2013.01); *H01L 27/0292* (2013.01); *H02H 9/046* (2013.01); *H01L 27/088* (2013.01)

(58) Field of Classification Search
CPC ............. H01L 27/0266; H01L 27/0255; H01L 27/0292; H01L 27/088; H01L 27/027
See application file for complete search history.

(56) References Cited

U.S. PATENT DOCUMENTS

| | | | |
|---|---|---|---|
| 7,307,295 B2 | 12/2007 | Velandia | |
| 8,299,503 B2 | 10/2012 | Catalasan et al. | |
| 9,042,065 B2 | 5/2015 | Van Wijmeersch et al. | |
| 2012/0098046 A1 | 4/2012 | Kim | |
| 2013/0163128 A1* | 6/2013 | Van Wijmeersch | H02H 9/046 361/56 |

OTHER PUBLICATIONS

Dai, C. et al., ESD Protection Design with Stacked Low-Voltage Devices for High-Voltage Pins of Battery-Monitoring IC, 2015, pp. 380-383, IEEE.

* cited by examiner

*Primary Examiner* — Meiya Li
(74) *Attorney, Agent, or Firm* — IP & T Group LLP

(57) ABSTRACT

A semiconductor integrated circuit device may include a pad, a first voltage protection unit and a second voltage protection unit. The first voltage protection unit may be connected with the pad. The first voltage protection unit may be configured to maintain a turn-off state when a test voltage having a negative level may be applied from the pad. The second voltage protection unit may be connected between the first voltage protection unit and a ground terminal. The second voltage protection unit may be turned-on when an electrostatic voltage having a positive level may be applied from the pad. The second voltage protection unit may include a plurality of gate positive p-channel metal oxide semiconductor (GPPMOS) transistors serially connected with each other.

13 Claims, 5 Drawing Sheets

SEMICONDUCTOR INTEGRATED CIRCUIT DEVICE INCLUDING AN ELECTROSTATIC DISCHARGE PROTECTION CIRCUIT

CROSS-REFERENCES TO RELATED APPLICATION

The present application claims priority under 35 U.S.C. § 119(a) to Korean patent application number 10-2017-0067643, filed on May 31, 2017, which is incorporated herein by reference in its entirety.

BACKGROUND

1. Technical Field

Various embodiments generally relate to a semiconductor integrated circuit device, and, more particularly, to a semiconductor integrated circuit device including an electrostatic discharge protection circuit.

2. Related Art

Typically, in order to protect an internal circuit from an electrostatic, a semiconductor integrated circuit device may include an electrostatic discharge (ESD) protection circuit between a pad receiving or transmitting an external signal, an external voltage or an address, or between the pad and the internal circuit.

A semiconductor integrated circuit device may further include a test pad configured to receive a test voltage or directly make contact with a test needle. The test pad may receive various voltage levels such as a negative voltage having a low voltage level, a positive voltage having a high voltage level, and the like, and provide these voltages to a test circuit and the internal circuit of the semiconductor integrated circuit device.

However, typically, an additional ESD protection circuit is not connected between the test pad and the test circuit. Hence, although the ESD protection circuit may be electrically connected with the test pad, it may be difficult to differentiate between a normal high voltage and an electrostatic voltage.

That is, in the ESD protection circuit for a high voltage, it may be required to set a trigger voltage for operating the ESD protection circuit higher than the normal high voltage and lower than the electrostatic voltage. Further, in the ESD protection circuit, it may be required to set a critical voltage, i.e., a holding voltage at which a latch-up may be generated higher than the normal high voltage.

SUMMARY

Example embodiments may provide a semiconductor integrated circuit device including an ESD protection circuit that may be readily controlled.

In an embodiment, a semiconductor integrated circuit device may include a pad, a first voltage protection unit and a second voltage protection unit. The first voltage protection unit may be connected with the pad. The first voltage protection unit may be configured to maintain a turn-off state when a test voltage having a negative level may be applied from the pad. The second voltage protection unit may be connected between the first voltage protection unit and a ground terminal. The second voltage protection unit may be turned-on when an electrostatic voltage having a positive level may be applied from the pad. The second voltage protection unit may include a plurality of gate positive p-channel metal oxide semiconductor (GPPMOS) transistors serially connected with each other.

In an embodiment, a semiconductor integrated circuit device may include an ESD protection circuit. The ESD protection circuit may be turned-off when a normal voltage may be applied from the pad. The ESD protection circuit may be driven by a voltage of no less than and no more than the normal voltage. The ESD protection circuit may include a PN diode, a plurality of GPPMOS transistors serially connected with each other and a voltage transmission path. The PN diode may be turned-off when a voltage applied from the pad may include the normal voltage having a negative level. The GPPMOS transistors may be driven when the voltage applied from the pad may include an electrostatic voltage having a positive level to remove the electrostatic voltage. The voltage transmission path may be selectively connected between any one of connection nodes between the GPPMOS transistors and a ground terminal.

In an embodiment, a semiconductor integrated circuit device may include a P type semiconductor substrate, an N well, a plurality of gates, a source/drain and a diode region. The N well may be formed in the P type semiconductor substrate. The gates may be arranged on the N well. The source/drain may be formed in the N well at both sides of each of the gates. The source/drain may include heavily doped P type impurities. The diode region may be formed in the N well. The gate may be commonly connected with the source to form a plurality of GPPMOS transistors. The GPPMOS transistors may be serially connected with each other. The diode region may be electrically connected with the pad. The diode region may electrically make contact with the source of the GPPMOS transistor.

According to example embodiments, the ESD protection circuit may be configured to perform ESD protection operations with respect to two directions of the negative voltage and the positive voltage applied from the pad.

Further, the second voltage protection unit for removing the positive electrostatic voltage may include the serially connected GPPMOS transistors. Thus, it may not be required to consider a snapback voltage when a trigger voltage may be set.

Furthermore, the ESD protection circuit may include a circuit having a plurality of revision units. Thus, numbers of elements in the ESD protection circuit may be controlled in accordance with generations or a size of the static electricity.

These and other features and advantages of the present invention will become apparent for the following detailed description in conjunction with the accompanying drawings.

DETAILED DESCRIPTION

Hereinafter, the present invention will be described below with reference to the accompanying drawings through various exemplary embodiments.

Figure 1:
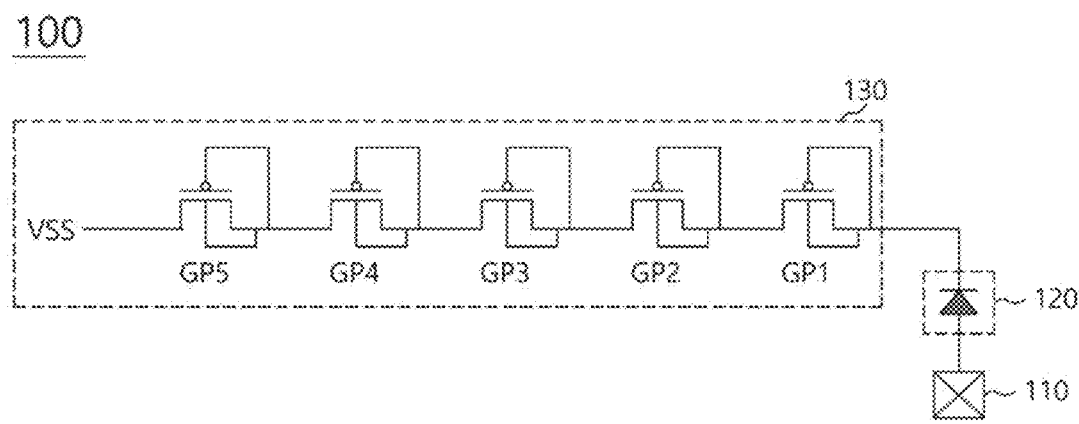
FIG. 1 is a circuit diagram illustrating an ESD protection circuit for a semiconductor integrated circuit device in accordance with example embodiments.

FIG. 1 is a circuit diagram illustrating an ESD protection circuit which is generally designated with reference numeral 100, in accordance with exemplary embodiments.

Referring to FIG. 1, the ESD protection circuit 100 may include a first voltage protection unit 120 and a second voltage protection unit 130.

The first voltage protection unit 120 may be connected between a pad 110 and the second voltage protection unit 130. For example, the pad 110 may include a test pad or a probe pad configured to receive a test signal.

The first voltage protection unit 120 may include a PN diode. When a voltage applied to the pad 110, i.e., a positive voltage is higher than a threshold voltage thereof, the first voltage protection unit 120 may be driven as a forward diode. In contrast, when a voltage applied to the pad 110, i.e., a negative voltage is lower than a breakdown voltage, the first voltage protection unit 120 may be connected to the pad 110 to be driven as a reverse diode. For example, the PN diode in the first voltage protection unit 120 may include an anode connected to the pad, and a cathode connected to the first voltage protection unit 120.

For example, when a normal voltage having a negative level is inputted into the first voltage protection unit 120 through the pad 110, the first voltage protection unit 120 is turned-off so that the ESD protection circuit is not driven. The first voltage protection unit 120 keeps a turn-off state until a breakdown voltage of the PN diode is inputted to the test pad.

The second voltage protection unit 130 is connected between the first voltage protection unit 120 and a voltage terminal VSS. The voltage terminal VSS may be a ground terminal. The second voltage protection unit 130 may include a plurality of gate positive p-channel metal oxide semiconductor (GPPMOS) transistors GP1~GP5. The GPPMOS transistors GP1~GP5 are connected with each other in series, between the first voltage protection unit 120 and the ground terminal VSS. For example, the first GPPMOS transistor GP1 may include a source connected with the first voltage protection unit 120, and a drain connected with a source of the second GPPMOS transistor GP2.

Because the GPPMOS transistors GP1~GP5 are connected in series, electrostatic inputted from the pad 110 may be reduced to a trigger voltage of each of the GPPMOS transistors GP1~GP5. The reduced electrostatic may then be discharged.

Each of the GPPMOS transistor GP1~GP5 may have a PMOS transistor including a gate connected with a source thereof. Generally, when a positive voltage is applied to the gate of the PMOS transistor, a snapback characteristic is not generated in the GPPMOS transistor which is to be contrasted with when a gate grounded NMOS (GGNMOS) transistor is used. Therefore, when setting a trigger voltage of the GPPMOS transistor, it is not required to consider snapback. Snapback refers to a phenomenon when a negative resistance occurs because of a large voltage drop generated due to a conductivity modulation after a voltage difference between a collector and an emitter increases to more than a predetermined level. As a result, a holding voltage may not be decreased to reduce a latch-up.

Further, the gate and the source of each of the GPPMOS transistors GP1~GP5 are commonly connected with each other so that the GPPMOS transistors GP1~GP5 can be driven like diodes. Thus, when the negative voltage between the breakdown voltage and the ground voltage (VSS) is applied to the pad 110, an equivalent circuit of the ESD protection circuit of FIG. 1 can be as the one shown in FIG. 2.

Figure 2:
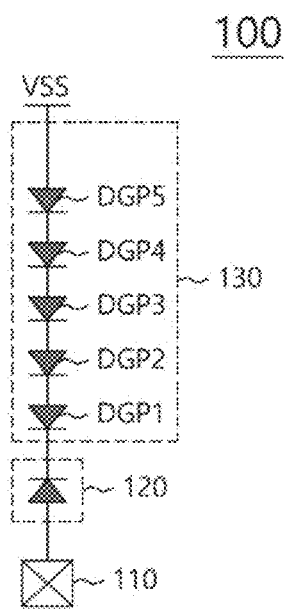
FIG. 2 is an equivalent circuit diagram illustrating the ESD protection circuit of FIG. 1 when a negative electrostatic voltage is applied to a pad.

FIG. 2 is an equivalent circuit diagram illustrating the ESD protection circuit in FIG. 1 when a negative electrostatic voltage is applied to a pad.

Referring to FIG. 2, serially connected diodes DGP1~DGP5 are connected between the first voltage protection unit 120 and the ground terminal VSS. The diodes DGP1~DGP5 in the second voltage protection unit 130 may be driven opposite to the PN diode in the first voltage protection unit 120. The diodes DGP1~DGP5 correspond to the GPPMOS transistors GP1~GP5 of FIG. 1, respectively.

Referring back to FIG. 1, the number of the GPPMOS transistors GP1~GP5 in the second voltage protection unit 130 may be determined in accordance with a maximum high voltage level among the normal voltage and an ESD voltage. For example, the normal voltage may have a level of from about −2V to about 28V and the ESD voltage may have a level higher than about 30V. A threshold voltage of the GPPMOS transistor may be about 6V. A threshold voltage of the first voltage protection unit 120 may be about 0.7V. When the at least four GPPMOS transistors and the first voltage protection unit 120 are connected in series, a parasitic PNP path is generated and the electrostatic voltage discharge is provided by the following formula 1.

$$6\ (\text{Volt}) \times 5 + 0.7\text{V} = 30.7\text{V} \qquad \text{Formula 1}$$

Figure 3:
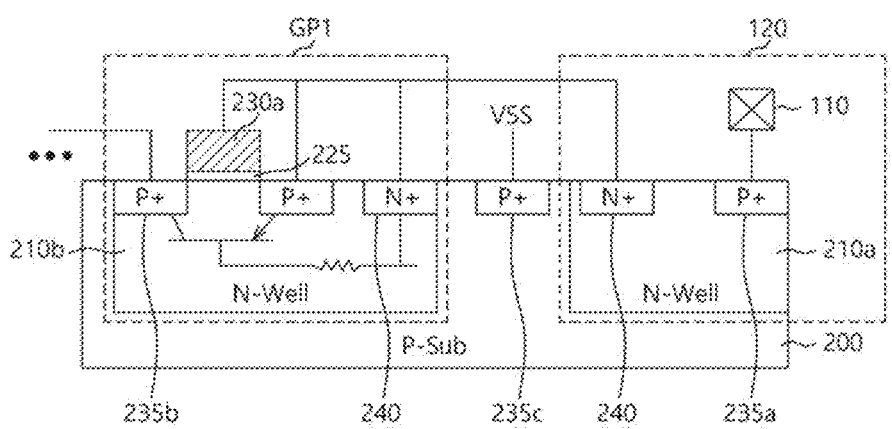
FIG. 3 is a cross-sectional view illustrating the ESD protection circuit of FIG. 1 on a semiconductor substrate.

FIG. 3 is a cross-sectional view illustrating the ESD device of FIG. 1 on a semiconductor substrate. FIG. 3 shows the first voltage protection unit 120 and the first GPPMOS transistor GP1 of FIG. 1. Although not depicted in FIG. 3, the second to fifth GPPMOS transistors GP2~GP5 of FIG. 1 may be implemented substantially the same as the first GPPMOS transistor GP1.

Referring to FIG. 3, a P type semiconductor substrate 200 may be doped with N type impurities to form an active region including N wells 210a and 210b. The first N well 210a may be the active region for defining the first voltage protection unit 120. The second N well 210b may be the active region for defining the GPPMOS transistors GP1~GP5 of the second voltage protection unit 130. Only one GPPMOS transistor is illustrated in FIG. 3 for simplicity.

A gate 230a of the first GPPMOS transistor GP1 may be formed on the semiconductor substrate 200 including the second N well 210b. A gate insulating layer 225 may be formed between the gate 230a and the semiconductor substrate 200. P type impurities having a high concentration may be implanted into the first N well 210a and the second N well 210b between the gates 230a to form a PN diode region 235a of the first voltage protection unit 120 and a source/drain of the GPPMOS transistor GP1. The PN diode may be integrated in the first N well 210a. The GPPMOS transistor GP1 may be integrated in the second N well 210b. A P type impurity region 235c having a high concentration may be formed in the P type semiconductor substrate 200. The P type impurity region 235c having the high concentration may be formed simultaneously with the diode region 230a and the source/drain 230b. The P type impurity region 235c may correspond to a substrate pick-up region for applying the ground voltage VSS to the semiconductor substrate 200.

N type impurities having a high concentration may be implanted into the first N well 210a and the second N well 210b to form a well pick-up region 240. The well pick-up region 240 may correspond to a region for applying a voltage to the N wells 210a and 210b.

For example, when the high voltage electrostatic having the positive level is applied from the pad 110, the first voltage protection unit 120 can act as the forward diode to generate a voltage drop corresponding to the threshold voltage of the first voltage protection unit 120.

The electrostatic passing through the first voltage protection unit 120 is transmitted to the second voltage protection unit 130. Because the electrostatic having the high voltage level is applied to the source of the first GPPMOS transistor GP1, a voltage difference may be generated between the source and a body, for example, the N well of the first GPPMOS transistor GP1 and between the body and the drain of the first GPPMOS transistor GP1 to generate a parasitic PNP bipolar junction transistor (BJT) in the N well 210 in which the first GPPMOS transistor GP1 may be formed. The electrostatic in the first GPPMOS transistor GP1 may be reduced by the threshold voltage or the trigger voltage of the first GPPMOS transistor GP1 by the parasitic PNP BJT. The threshold voltage may correspond to a threshold voltage of the parasitic PNP BJT. The threshold voltage may be lower than a gate breakdown voltage of the GPPMOS transistor.

The reduced electrostatic may be transmitted to the second GPPMOS transistor GP2 adjacent to the first GPPMOS transistor GP1. The electrostatic may operate the parasitic PNP BIT in the second GPPMOS transistor GP2 to further drop the electrostatic. Thus, the serially connected third, fourth and fifth GPPMOS transistors GP3, GP4 and GP5 may be sequentially driven to discharge most of the electrostatic.

The source, the body and the drain of the GPPMOS transistors may be operated as an emitter, a base and a collector of the parasitic PNP BJT, respectively. The electrostatic transmitted through the first voltage protection unit 120 may be reduced by the threshold voltage of the GPPMOS transistor. A large part of the electrostatic may be discharged by passing through the GPPMOS transistors.

The threshold voltages of the first to fifth GPPMOS transistors GP1~GP5 may be selected to decrease sequentially.

The body used as the base of the parasitic PNP BJT, i.e., a concentration of the N well 210b may be inversely proportional to the breakdown voltage of the PMOS transistor according to the formula 2.

$$VB = \varepsilon_s E^2 / 2eN_B \qquad \text{Formula 2}$$

In Formula 2, VB is the breakdown voltage, $\varepsilon_s$ represents a dielectric constant of the body, E indicates a maximum electric field of the source/drain, and $N_B$ represents the concentration of the body.

When the P well is formed in the semiconductor substrate and the N well is formed in the P well, the high positive voltage can flow to apply the high voltage to the N well. A leakage current may be generated due to the breakdown voltage between the N well and P well. In order to prevent the generation of the leakage current, the N well 210 may be formed in the P type semiconductor substrate 200.

The concentration of the P well in the P type semiconductor substrate 200 may be higher than the doping concentration of the P type semiconductor substrate 200 with the bare state. Thus, when the N well is formed in the P type semiconductor substrate 200, a relatively high breakdown voltage is formed compared to when the N well and the P well is formed in the P type semiconductor substrate 200 to prevent the generation of the leakage current in discharging the electrostatic.

Figure 4:
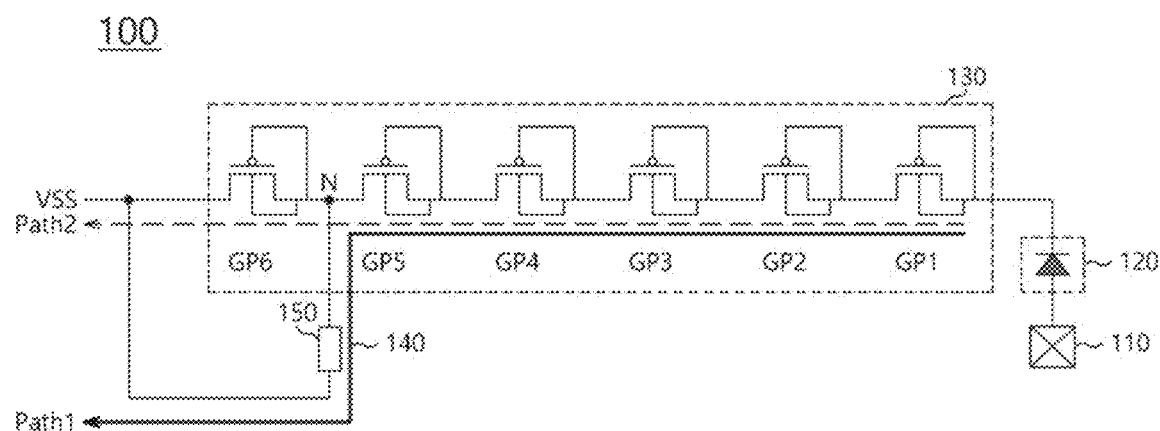
FIG. 4 is a circuit diagram illustrating a semiconductor integrated circuit device including an ESD protection circuit in accordance with example embodiments.

FIG. 4 is a circuit diagram illustrating a semiconductor integrated circuit device including an ESD protection circuit in accordance with example embodiments.

Referring to FIG. 4, when the at least five GPPMOS transistors GP1~GP5 may be required so as to discharge the positive electrostatic, a sixth GPPMOS transistor GP6 may be revisably connected with the fifth GPPMOS transistor GP5. The sixth GPPMOS transistor GP6 may be used for a preliminary transistor to discharge the positive electrostatic.

The ESD protection circuit 100 may further include a transmission path 140 between a connection node N between the fifth and sixth GPPMOS transistors GP5 and GP6, and the ground terminal Vss. The transmission path 140 may be used for revising the ESD protection circuit 100. A revision unit 150 may be arranged on the transmission path 140 to selectively open or close the transmission path 140.

When a device including the GPPMOS transistor is manufactured, unintended threshold voltage characteristic changes may be generated due to a process, a voltage, a temperature, i.e., PVT, change or some other reason.

Therefore, although theoretically the discharging of all of the electrostatic may be calculated to be achieved by serially connecting the five GPPMOS transistors with each other, an actual reduced amount of the electrostatic may be decreased due to a threshold voltage change resulting in at least part of the electrostatic flowing in the internal circuit.

In example embodiments, the revision unit 150 may be selectively opened and closed to optionally drive the sixth GPPMOS transistor GP6 as the second voltage protection unit 130 when the PVT may be changed.

When the PVT is not changed, the revision unit 150 is closed. Thus, the transmission path 140 may be generated between the connection node N and the ground terminal Vss. The static electricity, for example, the ESD voltage, passing through the fifth GPPMOS transistor GP5 may be discharged to the ground terminal Vss through the transmission path 140 having a relatively low resistance, i.e., through path 1.

When the threshold voltage of the GPPMOS transistor is decreased due to the generation of the PVT, the revision unit 150 is opened. The transmission path 140 may not be generated between the connection node N and the ground terminal Vss. The electrostatic voltage, for example, the ESD voltage passing through the fifth GPPMOS transistor GP5 may flow in the sixth GPPMOS transistor GP6, i.e., through a path 2.

In example embodiments, the opening and closing of the revision unit 150 may be changed on a layout.

Figure 5:
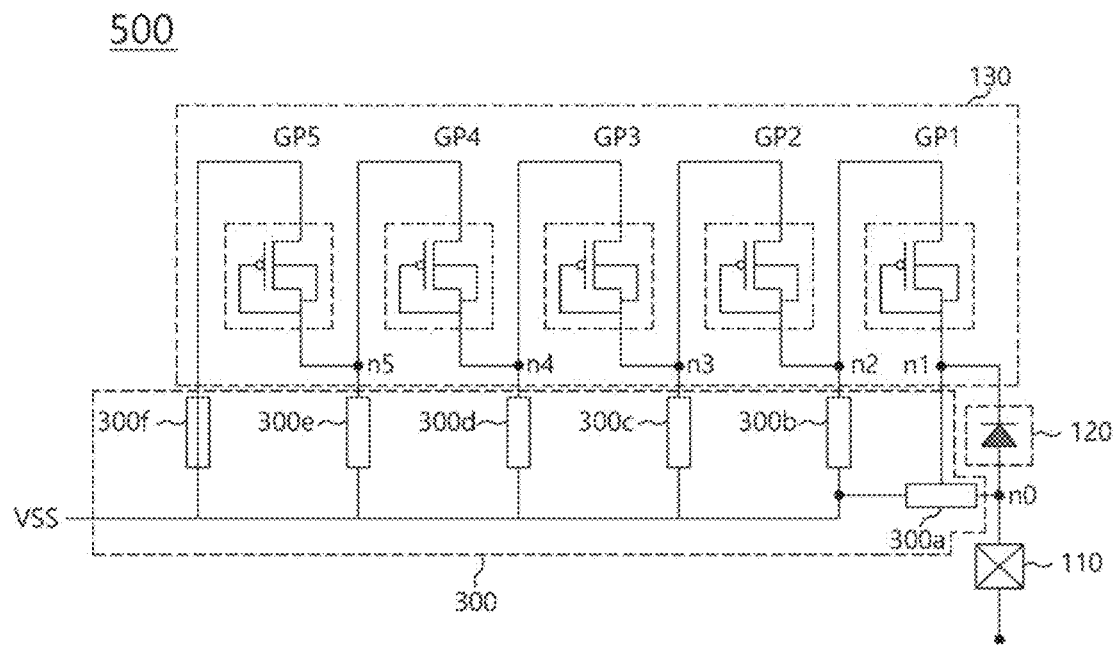
FIGS. 5 and 6 are circuit diagrams illustrating a semiconductor integrated circuit device including an ESD protection circuit connected with a pad in accordance with example embodiments.
Figure 6:
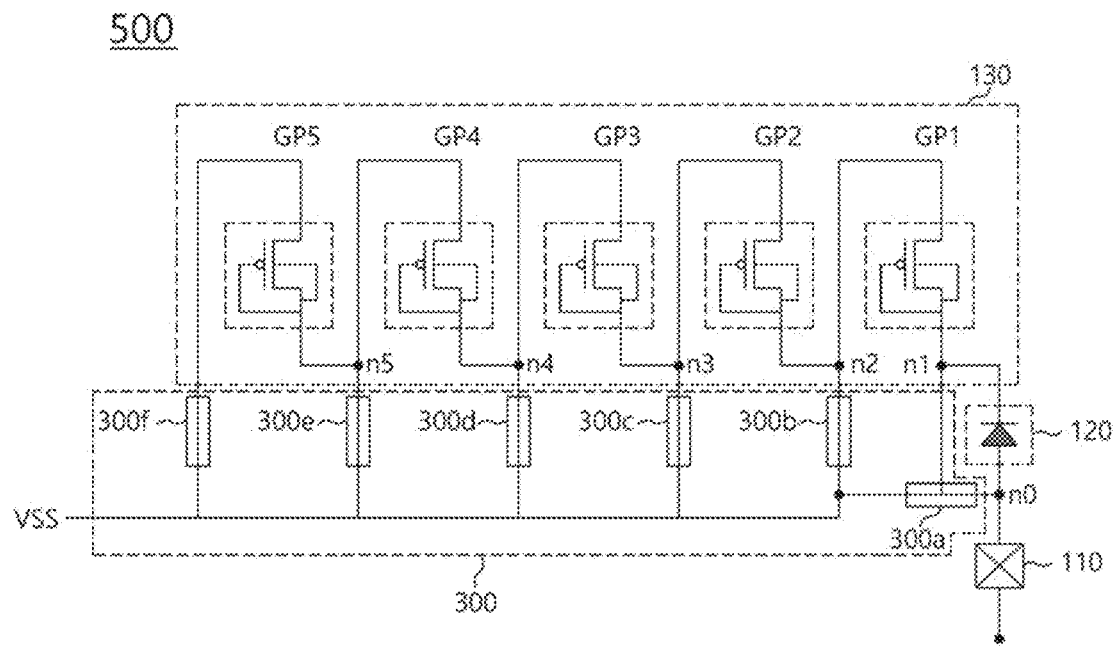

FIGS. 5 and 6 are circuit diagrams illustrating a semiconductor integrated circuit device including an ESD protection circuit connected with a pad in accordance with example embodiments.

Referring to FIG. 5, a semiconductor integrated circuit device of this example embodiment may include an ESD protection circuit 500 and a pad 110. The ESD protection circuit 500 may include a first voltage protection unit 120, a second voltage protection unit 130 and a circuit revision unit 300.

The pad 110 may include a test pad or a probe pad configured to receive a test signal or a high voltage.

The first voltage protection unit 120 may include a PN diode connected with the pad 110. The first voltage protection unit 120 may have a structure substantially the same as the first voltage protection unit 120 in FIG. 1. The PN diode may include an anode connected with the pad 110, and a cathode connected with the second voltage protection unit 130.

The second voltage protection unit 130 may have a structure substantially the same as the second voltage protection unit 130 in FIG. 1. The second voltage protection unit 130 may include a plurality of GPPMOS transistors GP1~GP5 connected in series. The GPPMOS transistors GP1~GP5 may be integrated in each of the N wells 201b on the P type semiconductor substrate 200, as shown in FIG. 3.

The circuit revision unit 300 is configured to change voltage transmission paths between the pad 110, the first voltage protection unit 120, the second voltage protection unit 130 and the ground terminal Vss. The circuit revision unit 300 may be connected between the pad 110, the first voltage protection unit 120, the second voltage protection unit 130 and the ground terminal Vss to generate or block the voltage transmission paths. The circuit revision unit 300 may include a plurality of revising members 300a~300f.

When the second voltage protection unit 130 may include the five GPPMOS transistors GP1~GP5, the circuit revision unit 300 may include the six revising members 300a~300f.

The first revising member 300a may be connected between a connection node n0, which may be located between the pad and the first voltage protection unit 120, and the ground terminal Vss. The first revising member 300a may be connected between a first connection node n1, which may be located between the first voltage protection unit 120 and the second voltage protection unit 130, and the ground terminal Vss. Thus, the first revising member 300a may be selectively opened or closed to connect the pad 110 or the first connection node n1 with the ground terminal Vss.

The second revising member 300b may be connected between a second connection node n2, which may be located between the first GPPMOS transistor GP1 and the second GPPMOS transistor GP2, and the ground terminal Vss. The third revising member 300c may be connected between a third connection node n3, which may be located between the second GPPMOS transistor GP2 and the third GPPMOS transistor GP3, and the ground terminal Vss. The fourth revising member 300d may be connected between a fourth connection node n4, which may be located between the third GPPMOS transistor GP3 and the fourth GPPMOS transistor GP4, and the ground terminal Vss. The fifth revising member 300e may be connected between a fifth connection node n5, which may be located between the fourth GPPMOS transistor GP4 and the fifth GPPMOS transistor GP5, and the ground terminal Vss. The sixth revising member 300f may be connected between the drain of the fifth GPPMOS transistor GP5 and the ground terminal Vss. FIG. 5 indicates the circuit revision unit 300 having the plurality of revising members 300a~300f with an open state and FIG. 6 indicates the circuit revision unit 300 having the plurality of revising members 300a~300f with a closing state.

Each of the revising members 300a~300f may be selectively opened or closed in accordance with inflow of the electrostatic or a voltage size of the electrostatic to connect the pad 110 or the first voltage protection unit 120 with the ground terminal Vss, or to control the numbers of the GPPMOS transistors in the second voltage protection unit 130.

For example, when it is required to drive all of the first to fifth GPPMOS transistors GP1~GP5 in the second voltage protection unit 130 in accordance with the voltage size of the electrostatic, as shown in FIG. 5, the first to fifth revising members 300a~300e may be opened and the sixth revising member 300f may be only closed. Thus, the ESD protection circuit 500 just includes the first to fifth GPPMOS transistors GP1~GP5 connected in series.

Further, the first to sixth revising members 300a~300f may be selectively closed in accordance with the voltage size of the electrostatic to control the numbers of the serially connected GPPMOS transistors GP1~GP5.

When it is not required to drive the ESD protection circuit 500, that is, the normal voltage may be inputted from the pad 110, all of the first to sixth revising members 300a~300f may be closed, the electrostatic voltage inputted from the pad 110 may be directly transmitted to the ground terminal Vss without inflows of the voltage into the first and second voltage protection units 120 and 130.

When the negative voltage is inputted from the pad 110, the first voltage protection unit 120 may be driven as the reverse diode. Thus, when the normal voltage having the negative level may be inputted, the trigger voltage of the ESD protection circuit 500 may be controlled to prevent driving of the ESD protection circuit 500.

According to example embodiments, the ESD protection circuit may be configured to perform ESD protection operations with respect to two directions of the negative voltage and the positive voltage applied from the pad.

Further, the second voltage protection unit for removing the positive electrostatic voltage may include the serially connected GPPMOS transistors. Thus, it may not be required to consider a snapback voltage when a trigger voltage may be set.

Furthermore, the ESD protection circuit may include a circuit having a plurality of revision units. Thus, numbers of elements in the ESD protection circuit may be controlled in accordance with generations or a size of the electrostatic.

Figure 7:
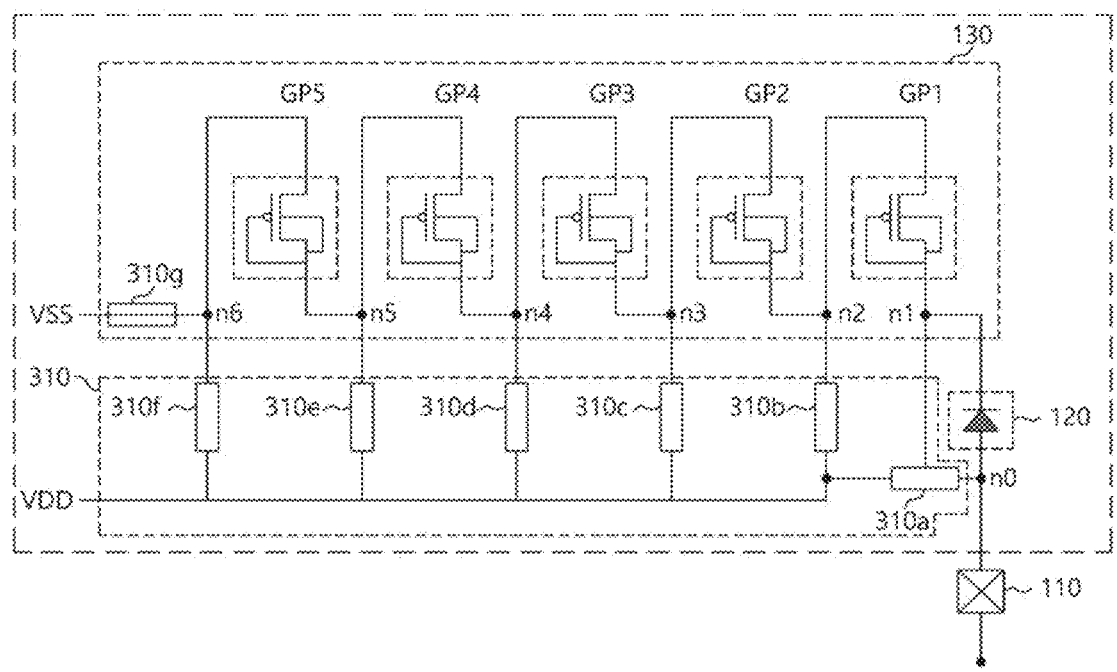
FIGS. 7 and 8 are circuit diagrams illustrating a semiconductor integrated circuit device including an ESD protection circuit connected with a pad in accordance with another example embodiment.
Figure 8:
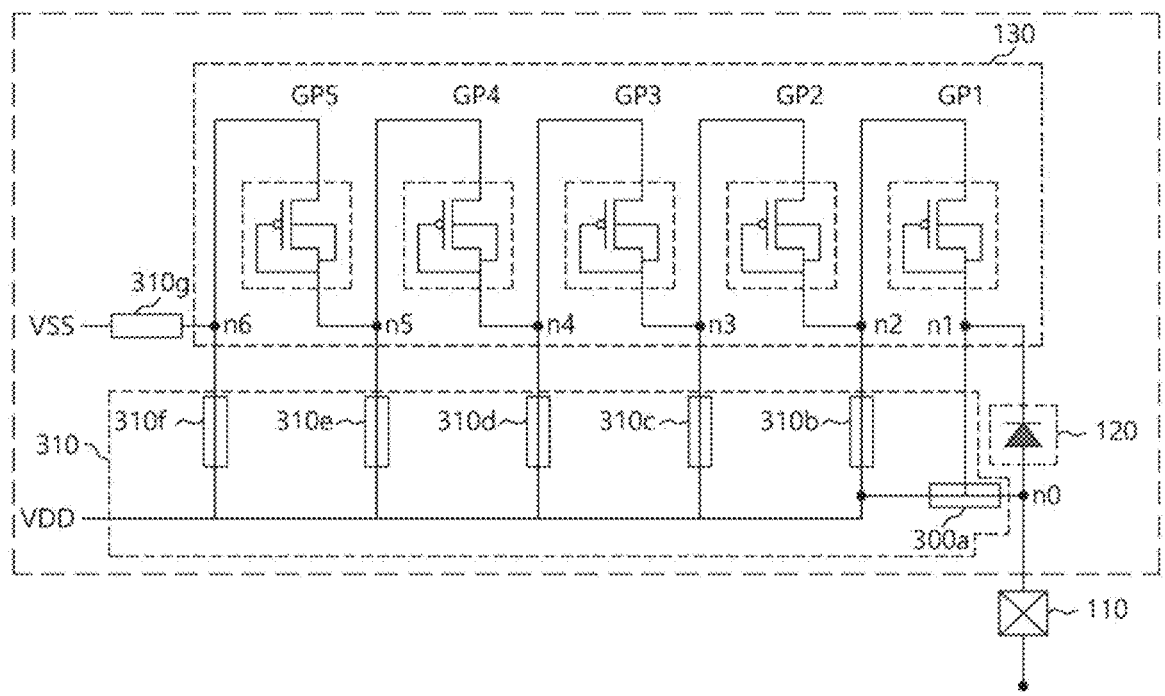

FIGS. 7 and 8 are circuit diagrams illustrating a semiconductor integrated circuit device including an ESD protection circuit connected with a pad in accordance with another example embodiment.

Referring to FIG. 7 and FIG. 8, the circuit revision unit 310 may be configured to be connected to voltage terminals, for example, a power supply terminal VDD and a ground terminal VSS. For example, the circuit revision unit 310 may include a plurality of revising members 310a~310g.

When the second voltage protection unit 130 may include the five GPPMOS transistors GP1~GP5, the circuit revision unit 300 may include seven revising members 310a~310f.

The first revising member 310a may be connected between a connection node n0, which may be located between the pad and the first voltage protection unit 120, and the power supply terminal VDD. The first revising member 310a may be connected between a first connection node n1, which may be located between the first voltage protection unit 120 and the second voltage protection unit 130, and the power supply terminal VDD. Thus, the first revising member 300a may be selectively opened or closed to connect the pad 110 or the first connection node n1 with the power supply terminal VDD.

The second revising member 310b may be connected between a second connection node n2, which may be located between the first GPPMOS transistor GP1 and the second GPPMOS transistor GP2, and the power supply terminal VDD. The third revising member 310c may be connected between a third connection node n3, which may be located between the second GPPMOS transistor GP2 and the third GPPMOS transistor GP3, and the power supply terminal VDD. The fourth revising member 310d may be connected between a fourth connection node n4, which may be located between the third GPPMOS transistor GP3 and the fourth GPPMOS transistor GP4, and the power supply terminal VDD. The fifth revising member 310e may be connected between a fifth connection node n5, which may be located between the fourth GPPMOS transistor GP4 and the fifth GPPMOS transistor GP5, and the power supply terminal VDD. The sixth revising member 310f may be connected between the drain n6 of the fifth GPPMOS transistor GP5 and the power supply terminal VDD. The seventh revising member 310g may be connected between the drain n6 of the fifth GPPMOS transistor GP5 and the ground terminal Vss. FIG. 7 indicates the circuit revision unit 310 having the plurality of revising members 300a~300f with an open state and FIG. 8 indicates the circuit revision unit 300 having the plurality of revising members 310a~310f with an closing state. In case, an additional revising member (not shown) may be connected between the first voltage protection unit 120 and the first connection node n0.

According to the ESD protection circuit 100 is connected to the power supply terminal VDD and the ground terminal VSS, the electrostatic voltage is effectively discharged through the power supply terminal VDD and the ground terminal VSS.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A semiconductor integrated circuit device comprising:
   a pad;
   a first voltage protection unit connected to the pad, the first voltage protection unit configured to maintain a turn-off state when a voltage having a negative level is applied from the pad;
   a second voltage protection unit connected between the first voltage protection unit and a voltage terminal, the second voltage protection unit configured to be turned-on when an electrostatic voltage flows from the pad, wherein the second voltage protection unit comprises a plurality of gate positive p-channel metal oxide semiconductor (GPPMOS) transistors connected with each other in series; and
   a circuit revision unit including a plurality of revising members to selectively change transmission paths of the voltage applied from the pad,
   wherein each of the plurality of revising members is individually connected directly to the second voltage protection unit.

2. The semiconductor integrated circuit device of claim 1, wherein the first voltage protection unit comprises a PN diode.

3. The semiconductor integrated circuit device of claim 2, wherein an anode of the PN diode is connected to the pad and a cathode of the PN diode is connected to an input of the second voltage protection unit.

4. The semiconductor integrated circuit device of claim 2, wherein the PN diode comprises;
   an N well; and
   a P type impurity region having a high concentration formed in the N well.

5. The semiconductor integrated circuit device of claim 4, wherein the N well is configured to directly make contact a P type semiconductor substrate.

6. The semiconductor integrated circuit device of claim 1, wherein numbers of the plurality of GPPMOS transistors in the second voltage protection unit are determined in accordance with a size of the electrostatic having the positive level.

7. The semiconductor integrated circuit device of claim 1, wherein the plurality of GPPMOS transistors have substantially a same threshold voltage.

8. The semiconductor integrated circuit device of claim 1, wherein any one among the plurality of GPPMOS transistors connected with the first voltage protection unit has the highest voltage.

9. The semiconductor integrated circuit device of claim 1, wherein the circuit revision unit further includes: an additional revising member connected to the first voltage protection unit and the voltage terminal.

10. A semiconductor integrated circuit device including an electrostatic discharge (ESD) protection circuit, the ESD protection circuit configured to be turned-off when a normal voltage is applied from a pad and to be turned-on when an abnormal voltage is applied from the pad, the ESD protection circuit of the semiconductor integrated circuit device comprising:
    a PN diode configured to be turned-off when the normal voltage having a negative level is inputted from the pad;
    a voltage protection unit including a plurality of GPPMOS transistors serially connected with each other driven by an electrostatic having a positive level inputted from the pad to remove the electrostatic;
    a voltage transmission path formed between the pad and a ground terminal, via at least one of the PN diode and the plurality of GPPMOS transistors; and
    a plurality of revising members wherein each revising member is individually connected directly to the voltage protection unit and is configured to be opened or closed to selectively transmit a voltage in a plurality of connection nodes of the plurality of GPPMOS transistors to the ground terminal, and wherein the PN diode and the voltage protection unit are serially connected between the pad and the ground terminal.

11. The semiconductor integrated circuit device of claim 10, wherein numbers of the plurality of GPPMOS transistors are greater than a ratio of the electrostatic with respect to a threshold voltage of the plurality of GPPMOS transistors, and each revising member is opened when the threshold voltage of the plurality of GPPMOS transistors is changed due to changes of a process, the voltage and a temperature to drive all of the plurality of GPPMOS transistors.

12. The semiconductor integrated circuit device of claim 10, wherein the PN diode and the plurality of GPPMOS transistors are formed in an N well configured to directly make contact with a P type semiconductor substrate.

13. The semiconductor integrated circuit device of claim 10, further comprising an additional revising member connected among the pad, the PN diode and the voltage terminal.

* * * * *